US012757496B2

(12) United States Patent
Holland

(10) Patent No.: US 12,757,496 B2
(45) Date of Patent: Oct. 6, 2026

(54) INSULATED-GATE BIPOLAR TRANSISTOR DEVICE AS WELL AS A DATA TRANSMISSION SYSTEM IMPLEMENTING SUCH INSULATED-GATE BIPOLAR TRANSISTOR DEVICE

(71) Applicant: NEXPERIA B.V., Nijmegen (NL)

(72) Inventor: Steffen Holland, Hamburg (DE)

(73) Assignee: Nexperia B.V., Nijmegen (NL)

( * ) Notice: Subject to any disclaimer, the term of this patent is extended or adjusted under 35 U.S.C. 154(b) by 283 days.

(21) Appl. No.: 18/423,511

(22) Filed: Jan. 26, 2024

(65) Prior Publication Data

US 2024/0258300 A1 Aug. 1, 2024

(30) Foreign Application Priority Data

Jan. 26, 2023 (EP) .................................... 23153397

(51) Int. Cl.
*H10D 89/60* (2025.01)

(52) U.S. Cl.
CPC .................................. *H10D 89/711* (2025.01)

(58) Field of Classification Search
CPC ... H10D 62/145; H10D 62/126; H10D 84/161
See application file for complete search history.

(56) References Cited

U.S. PATENT DOCUMENTS 5,576,557 A 11/1996 Ker
7,511,357 B2 * 3/2009 Hshieh ................ H10D 84/221 257/481
8,294,507 B2 10/2012 Zhang
10,043,791 B2 * 8/2018 Naito .................. H10D 62/112
10,249,610 B1 4/2019 Appaswamy
10,931,276 B1 * 2/2021 Suh ...................... H03K 17/602
10,950,690 B2 * 3/2021 Pfirsch ................. H10D 62/108
11,742,249 B2 * 8/2023 Kubouchi ............. H10P 74/203 257/140
2015/0069424 A1 * 3/2015 Willemen ............ H10D 89/611 257/84
2015/0162407 A1 * 6/2015 Laven .................. H10D 62/393 257/655
2017/0069620 A1 * 3/2017 Tu ......................... H10D 89/60
2017/0287894 A1 * 10/2017 Kuo ...................... H10D 89/611
2023/0103191 A1 * 3/2023 Bertuglia ............. H10D 12/481 257/140

* cited by examiner

*Primary Examiner* — Mounir S Amer
(74) *Attorney, Agent, or Firm* — Ruggiero McAllister & McMahon LLC

(57) ABSTRACT

An insulated-gate bipolar transistor device is provided including: a first region doped with a first type of charge carriers; a second region doped with a second type of charge carriers different from the first type of charge carriers; a third region doped with the first type of charge carriers; a fourth region doped with the second type of charge carriers; a first, emitter terminal electrically connected with the first region and a second, collector terminal electrically connected with the third region and the fourth region; and a gate structure disposed on the third region with one end adjacent to the second region and with another end adjacent the fourth region; as well as a diode structure having a first diode structure terminal electrically connected with the collector terminal and a second diode structure terminal electrically connected with the gate terminal of the gate structure.

18 Claims, 13 Drawing Sheets

INSULATED-GATE BIPOLAR TRANSISTOR DEVICE AS WELL AS A DATA TRANSMISSION SYSTEM IMPLEMENTING SUCH INSULATED-GATE BIPOLAR TRANSISTOR DEVICE

CROSS-REFERENCE TO RELATED APPLICATIONS

This application claims the benefit under 35 U.S.C. § 119(a) of European Patent Application No. 23153397.7 filed Jan. 26, 2023, the contents of which s are incorporated by reference herein in their entirety.

BACKGROUND

1. Field of the Disclosure

The present disclosure relates to an insulated-gate bipolar transistor device as well as a data transmission system implementing such insulated-gate bipolar transistor device. In particular, although not exclusively, the present disclosure pertains to applications involving electrostatic discharge (ESD) or electrical overstress (EOS) protection.

2. Description of the Related Art

Electrostatic discharge is a problem encountered in a range of electronic systems, including data transmission systems. When an ESD event occurs in a data transmission system, components of the data transmission system may be damaged if the discharge is not suitably dissipated by the system.

Semiconductor controlled rectifiers or SCRs are popular for ESD protection due to their deep snap-back and consequently low clamping voltage. The trigger voltages can be high, especially when a low capacitance is needed for proper operation. For reducing the trigger voltage, a well-known solution implements external triggering, that is using a current source with a low turn-on voltage to forward bias one emitter base junction of the SCR. For very low trigger voltages diode strings can be used for creating the necessary trigger current.

Accordingly, ESD protection devices need to have a low trigger voltage, possibly without a snapback and a low device capacitance. Open base transistors normally have a snapback, but can be tuned to low capacitance. A MOSFET has a very high capacitance (due its size). In addition, ESD protection devices are normally two pin devices, which means that the Gate terminal needs to be connected to one of the terminals, which increases the capacitance even further because of the thin gate oxide.

It is a goal of the present disclosure to provide an improved insulated-gate bipolar transistor device as well as a data transmission system implementing such insulated-gate bipolar transistor device obviating the above sketched issues.

SUMMARY

According to a first example of the disclosure, an insulated-gate bipolar transistor device is proposed, which device comprises a first region doped with a first type of charge carriers; a second region doped with a second type of charge carriers different from the first type of charge carriers; a third region doped with the first type of charge carriers; a fourth region doped with the second type of charge carriers; a first, emitter terminal electrically connected with the first region and a second, collector terminal electrically connected with the third region and the fourth region. Furthermore, a gate structure is used, being disposed on the third region with one end adjacent to the second region and with another end adjacent the fourth region.

According to the disclosure, insulated-gate bipolar transistor device also comprises a single diode structure or an antiparallel diode structure having a first diode structure terminal electrically connected with the emitter terminal and a second diode structure terminal electrically connected with the gate terminal of the gate structure. Such insulated-gate bipolar transistor (IGBT) device can be used as a stand-alone ESD protection device or as a trigger in an ESD protection device. The low capacitance of the pair of antiparallel diode devices hides the high capacitance of the gate oxide of the gate structure. In particular, the breakdown voltage of the device can be tuned by the Vth of the MOSFET and the MOSFET avoids a voltage snapback from occurring. Furthermore, such IGBT device functions as a bipolar device and therefore it can have a higher current density than a MOSFET device. Also, the antiparallel diodes reduce the overall capacitance, which feature further adds to the use of the IGBT device as a stand-alone ESD protection device or as a trigger in an ESD protection device.

In examples of the insulated-gate bipolar transistor device according to the disclosure, the first region is formed as a well in the second region and/or the third region is formed as a well in the second region and/or the fourth region is formed as a well in the third region. Accordingly, such IGBT device can be manufactured in a logical sequence of manufacturing steps.

Additionally, the third region may comprise a low dopant region adjoining the fourth region and the gate structure, and a high dopant region adjoining second terminal, wherein the doping of the high dopant region is higher than the doping of the low dopant region. This region forms the p-body of the MOSFET and requires a MOSFET channel. The different doping allows to tune the onset of the current flow of the IGBT.

In a further example, the second region may comprise a low dopant region adjoining the first region, and a high dopant region adjoining the third region and the gate structure, wherein the doping of the high dopant region is higher than the doping of the low dopant region. The high dopant region adjoining the third region and the gate structure functions as a punch through stopper suppressing any punch through leakage from the third region towards the first region.

In an additional example, by providing a further high dopant region in the second regions, which further high dopant region adjoins the third region and the second terminal and tunes the breakdown voltage of the device.

In further beneficial examples, the first region, the third region and/or the fourth region are high dopant regions to allow low a low ohmic contact between the contacting metal and the silicon.

It is noted that in a preferred example, each diode device of the antiparallel diode structure comprises a first diode region doped with a first type of charge carriers and a second diode region doped with a second type of charge carriers, and wherein the first diode region and the second diode region are formed as a well in the second region. In particular, the first diode region and/or the second diode region are high dopant regions to allow low a low ohmic contact between the contacting metal and the silicon.

Additionally, in an example, the second region may be provided with a boundary deep trench isolation structure for each diode device of the antiparallel diode structure. Optionally, each boundary deep trench isolation structure may comprise one or more buried bottom layers.

The disclosure also pertains to a current-controlled semiconductor system comprising a signal line for carrying a signal; a ground line for connecting to ground; and a semiconductor controlled rectifier, SCR, device. The SCR device may comprise a first SCR layer doped with a first type of charge carriers; a second SCR layer doped with a second type of charge carriers different from the first type of charge carriers; a third SCR layer doped with the first type of charge carriers; a fourth SCR layer doped with the second type of charge carriers. Moreover, an input SCR terminal is electrically connected with the first SCR layer and the signal line and an output SCR terminal electrically connected with the fourth SCR layer and the ground line. According to the disclosure at least one insulated-gate bipolar transistor device according to the disclosure is provided, which is electrically connecting the signal line and the third SCR layer. In this unidirectional example, the IGBT device functions as a trigger in the ESD protection device.

In a further, bidirectional example of the current-controlled semiconductor system according to the disclosure, the system comprises a further SCR device comprising a first SCR layer doped with a first type of charge carriers; a second SCR layer doped with a second type of charge carriers different from the first type of charge carriers; a third SCR layer doped with the first type of charge carriers; a fourth SCR layer doped with the second type of charge carriers; an input SCR terminal electrically connected with the first SCR layer and the ground line as well as an output SCR terminal electrically connected with the fourth SCR layer and the signal line; as well as at least one insulated-gate bipolar transistor device according to the disclosure electrically connecting the ground line and the third SCR layer.

The disclosure also pertains to another example of a current-controlled semiconductor system comprising a signal line for carrying a signal; a ground line for connecting to ground; and a semiconductor controlled rectifier, SCR, device. The SCR device may comprise a first SCR layer doped with a first type of charge carriers; a second SCR layer doped with a second type of charge carriers different from the first type of charge carriers; a third SCR layer doped with the first type of charge carriers; a fourth SCR layer doped with the second type of charge carriers. Moreover, an input SCR terminal is electrically connected with the first SCR layer and the signal line and an output SCR terminal electrically connected with the fourth SCR layer and the ground line. According to the disclosure at least one insulated-gate bipolar transistor device according to the disclosure is provided, which is electrically connecting electrically connecting the second layer and the third SCR layer. Also in this unidirectional example, the IGBT device functions as a trigger in the ESD protection device.

It should be noted, that for both the insulated-gate bipolar transistor, IGBT, device and the current-controlled semiconductor system, that the first type of charge carriers may be P-type carriers, whereas the second type of charge carriers may be N-type carriers. However, the reversed configuration, wherein the first type of charge carriers are N-type carriers and the second type of charge carriers are P-type carriers is equally appliable in achieving the desired effect of creating one of both of the emitter base junctions having a low capacitance.

Beneficial examples as to the high doping used may include a high dopant region having a doping greater than $1\times10^{15}$ cm$^{-3}$ and a layer thickness greater than 0.2 μm, more in particular a doping greater than $1\times10^{16}$ cm$^{-3}$ and a layer thickness greater than 1 μm. Likewise, as to the low doping, the low dopant region may have a doping smaller than $1\times10^{15}$ cm$^{-3}$ and a layer thickness greater than 1 μm, more in particular a doping smaller than $1\times10^{14}$ cm$^{-3}$ and a layer thickness greater than >2 μm.

BRIEF DESCRIPTION OF THE DRAWINGS

The disclosure will now be discussed with reference to the drawings, which show in.

DETAILED DESCRIPTION

Figure 1:
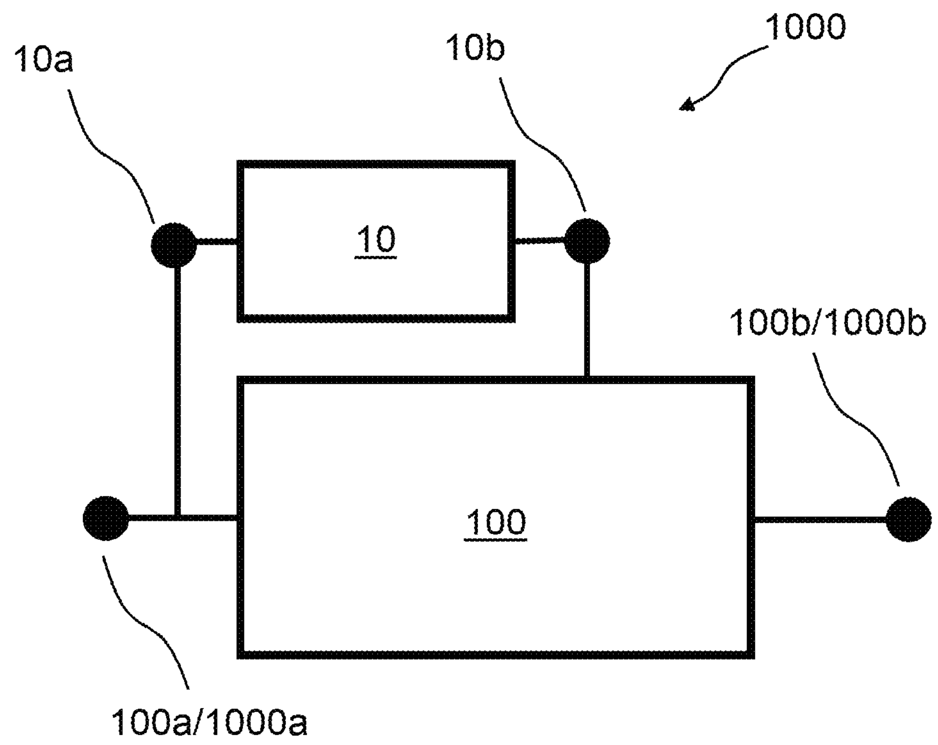
FIG. 1 an overview example of a data transmission system implementing an IGBT device according to the disclosure.

For a proper understanding of the disclosure, in the detailed description below corresponding elements or parts of the disclosure will be denoted with identical reference numerals in the drawings.

For the sake of clarity, it is noted that in this application several examples of IGBT devices according to the disclosure are depicted, whose configuration is formed of regions or layers of one or more semiconductor materials, which materials are doped with a first type of charge carriers or with a second type of charge carriers, and wherein the second type of charge carriers are different from the first type of charge carriers.

Throughout the following detailed description it is understood, that the first type of charge carriers are P-type carriers, and the second type of charge carriers are logically N-type carriers. However, the reversed configuration, wherein the first type of charge carriers are N-type carriers and the second type of charge carriers are P-type carriers is equally appliable in all examples described in this application, as both configurations (PN or NP) achieve the desired effect of reducing the overall capacitance of the IGBT device, which feature further adds to the use of the IGBT device as a stand-alone ESD protection device or as a trigger in an ESD protection device.

FIGS. 1 and 4A-4D depict examples of a data transmission system, denoted with reference numeral 1000 (1000$_1$-1000$_4$), implementing an IGBT device denoted with 10 (10-1, 10-2) according to the disclosure.

As outlined in the introduction of this application, electrostatic discharge is a problem encountered in a range of electronic systems, including data transmission systems. When an ESD event occurs in a data transmission system, components of the data transmission system may be damaged if the discharge is not suitably dissipated by the system.

Figure 2A:
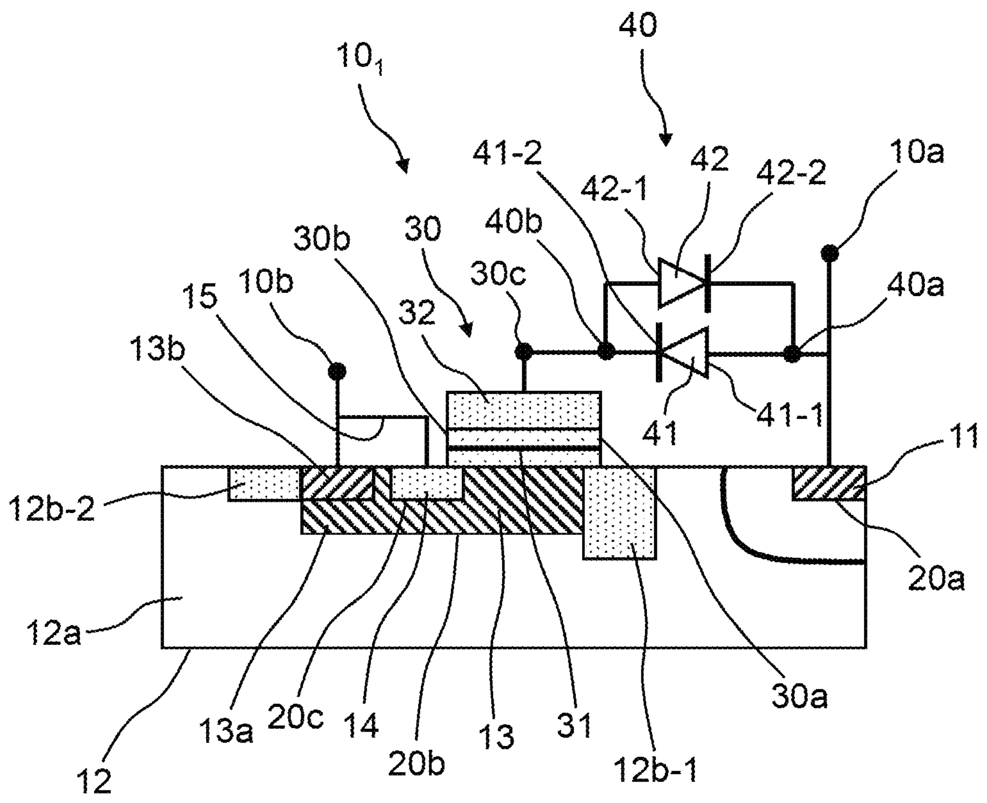
FIGS. 2A-2B a first example of an IGBT device according to the disclosure.

A first example of an IGBT device according to the disclosure exhibiting a low trigger voltage, no or limited a snapback and a low device capacitance is depicted in FIG. 2A.

In FIG. 2A, the insulated-gate bipolar transistor device is denoted with reference numeral $10_1$ and is composed of a substrate 12. Substrate 12 functions as a base substrate for the IGBT device $10_1$ and will be recalled throughout this application as a second region or layer 12 doped with doped a second type of charge carriers. Reference numeral 11 denotes a first layer or region of the IGBT device $10_1$ and the first layer or region is doped with a first type of charge carriers. The first type of charge carriers are different from the second type of charge carriers.

In this particular example, the first layer/region 11 is formed as a well in the second layer/region 12, the forming of a well can be accomplished using suitable and known semiconductor manufacturing techniques.

Reference numeral 13 denotes a third layer or region, which is doped with the first type of charge carriers as the first layer/region 11. The third layer/region 13 can be equally formed as a well in the second layer/region 12 using similar suitable and known semiconductor manufacturing techniques.

The IGBT device $10_1$ according to the disclosure furthermore comprises a fourth layer/region, which is doped with the second type of charge carriers, similar as the second layer/region 12. As shown in FIG. 2A, The fourth layer/region 14 can be equally formed as a well in the third layer/region 13 using suitable and known semiconductor manufacturing techniques.

The first layer/region 11 forms a first junction 20*a* with the second layer/region 12, whereas the second layer/region 12 forms a second junction 20*b* with the third layer/region layer 13. Similarly, the third layer/layer 13 forms a third junction 20*c* with the fourth layer/region 14.

A junction element or short 15 electrically interconnects the third layer/region 13 and the fourth layer/region 14. A first, emitter terminal 10*a* is electrically connected with the first layer/region 11 and a second, collector terminal 10*b* is electrically connected with the junction element or short 15, hence with the third layer/region 13 and the fourth layer/region 14.

In all examples of the IGBT devices $10_1$-$10_3$ according to the disclosure and depicted in this application, a gate structure 30 is provided. The gate structure 30 has a gate oxide 31 being disposed on the third region 13, such that a first end 30*a* of the gate structure 30 lies adjacent to or adjoins the second region 12 and that the second end 30*b* of the gate structure 30 lies adjacent to or adjoins the fourth region 14. In addition, the gate structure 30 is structured as a stack as it also comprises a gate material 32, e.g. a gate metal or gate non-metal material stacked on the gate oxide layer 31. The gate material 32 may be formed or comprised of a gate terminal 30*c*.

According to the disclosure, reference numeral 40 denotes a diode structure. The diode structure can be a single diode or structured as an antiparallel diode structure. In the example of an antiparallel diode structure, the antiparallel diode structure 40 is composed of a first diode structure terminal 40*a*, which is electrically connected with the collector terminal 10*a* as well as a second diode structure terminal 40*b*, which is electrically connected with the gate terminal 30*c* of the gate structure 30. Accordingly, this configuration of an insulated-gate bipolar transistor (IGBT) device implementing an antiparallel diode structure 40 can be used as a stand-alone ESD protection device or as a trigger in an ESD protection device.

The antiparallel diode structure 40 is composed of two diode devices 41 and 42, electrically connected in antiparallel configuration. Each diode devices 41/42 consists of a so-called p-n junction formed of first dopant regions or anodes 41-1/42-1 and second dopant region or cathodes 41-2/42-2.

In the example of a single diode structure a single diode device is implemented.

The low capacitance of the pair of antiparallel diodes hides the high capacitance of the gate oxide layer 31 of the gate structure 30. In particular, the breakdown voltage of the IGBT device $10_1$ can be tuned by the Vth of the MOSFET and the MOSFET avoids a voltage snapback from occurring. Furthermore, such IGBT device functions as a bipolar device and therefore it can have a higher current density than a MOSFET device. Also, the antiparallel diodes 41-42 reduce the overall capacitance, which feature further adds to the use of the IGBT device as a stand-alone ESD protection device or as a trigger in an ESD protection device.

Additionally, as shown in the FIGS. 2A-2B, 3A-3C, the third layer or region 13 may comprise a low dopant region 13*a* adjoining the fourth region 14 and the gate structure 30, and a high dopant region 13*b* directly adjoining the second terminal 10*b*. The doping of the high dopant region 13*b* is higher than the doping of the low dopant region 13*a*. The low doping region acts as the substrate of the MOSFET. By its doping the threshold voltage of the MOSFET can be tuned.

Also, in an example depicted in the Figures, the second region 12 has a low dopant region 12*a*, which low dopant region 12*a* adjoins the first region 11, and at least a high dopant region 12*b*-1. The high dopant region 12*b*-1 adjoins the third region 13, and the gate structure 30 and in a particular example adjoins the low dopant region 13*a* of the third layer/region 13 and the first end 30*a* of the gate structure 30. Also here, for the second layer/region 12, the doping of the high dopant region 12*b* is higher than the doping of the low dopant region 12*a*. The high dopant region 12*b* adjoining the third region 13 and the gate structure 30 functions as a punch through stopper suppressing any punch through leakage from the third region 13 towards the first region 11.

A further high dopant region 12*b*-2 in the second region 12 can be provided, which further high dopant region 12*b*-2 adjoins the third region 13 and the second emitter terminal 10*b*. In a particular example according to the disclosure, the further high dopant region 12*b*-2 adjoins the high dopant region 13*b* of the third region 13 which directly adjoins the second emitter terminal 10*b*. The location of the further high dopant region 12*b*-2 tunes the breakdown voltage of the device.

Additionally, the first region 11 and/or the fourth region 14 are high dopant regions, which means that the dopant of the first region 11 is higher than the dopant of the corresponding third layer/region 13 (in particular higher than the dopant of the low dopant region 13*a*) and the dopant of the fourth region 14 is higher than the dopant of the corresponding second layer/region 12 (in particular higher than the dopant of the low dopant region 12*a*). The high doping regions make sure that the electrical contact resistance is low between the interface of the contact metal and the silicon.

Figure 2B:
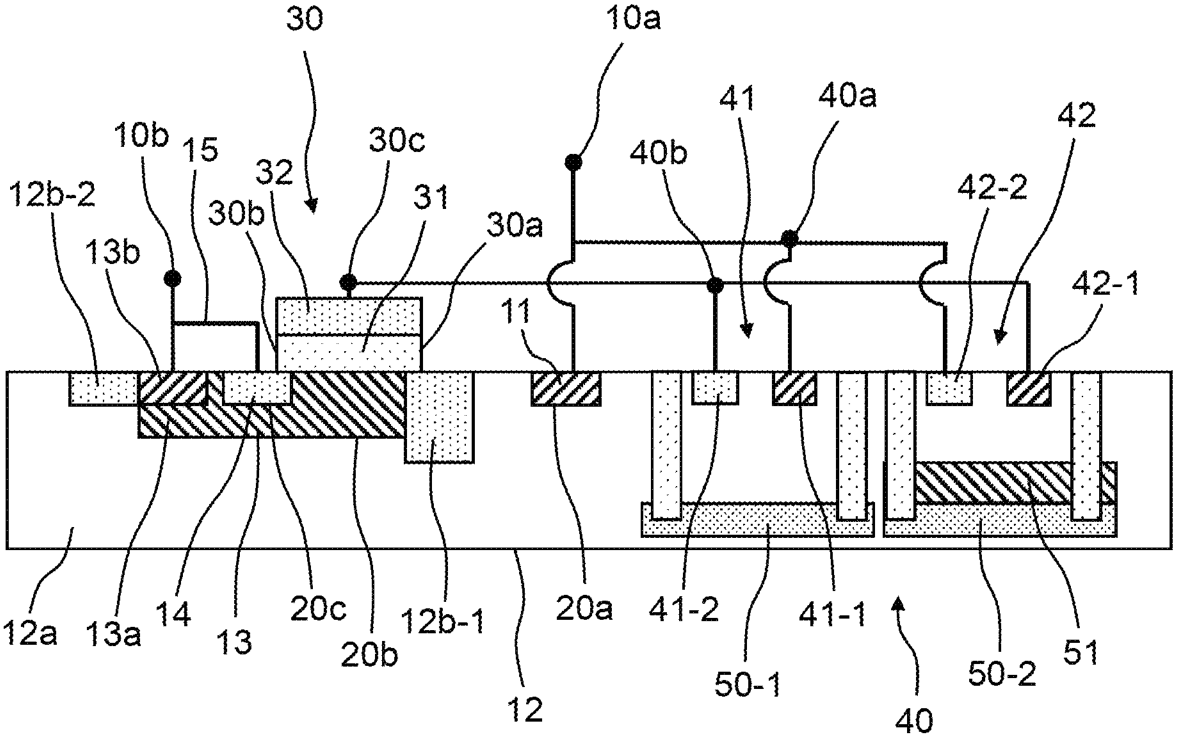

As shown in more detail in the example of FIG. 2B, each diode device 41-42 of the antiparallel diode structure 40 comprises a first diode region 41-1/42-1 doped with a first type of charge carriers and a second diode region 41-2/42-2 doped with a second type of charge carriers. Both the first diode regions 41-1/42-1 and the second diode regions 41-2/42-2 may be formed as wells in the second region 12, preferably in the low dopant region 12*a* of the second region 12.

As the second layer/region 12 functions as a base substrate for the IGBT device $10_1$ the wells 41-1/42-1 and 41-2/42-2 can be manufactured in a logical sequence of known manufacturing steps. Preferably, both first diode regions 41-1/42-1 and/or the second diode regions 41-2/42-2 are high dopant regions, in other words higher than the dopant of the corresponding second layer/region 12 (in particular higher than the dopant of the low dopant region 12*a*). This configuration enables a low junction capacitance of the diodes.

Boundary deep trench isolation structures 50-1 and 50-2 can be deposited in the substrate layer 12 (12*a*) for each diode device 41-42 of the antiparallel diode structure 40. Optionally, each boundary deep trench isolation structure 50-1, 50-2 may comprise one or more buried bottom layers 51. It should be noted that the isolation structures 50-1 and 40-2 can be formed as deep trenches in the substate layer 12 or by means of deep diffusion.

Figure 2C:
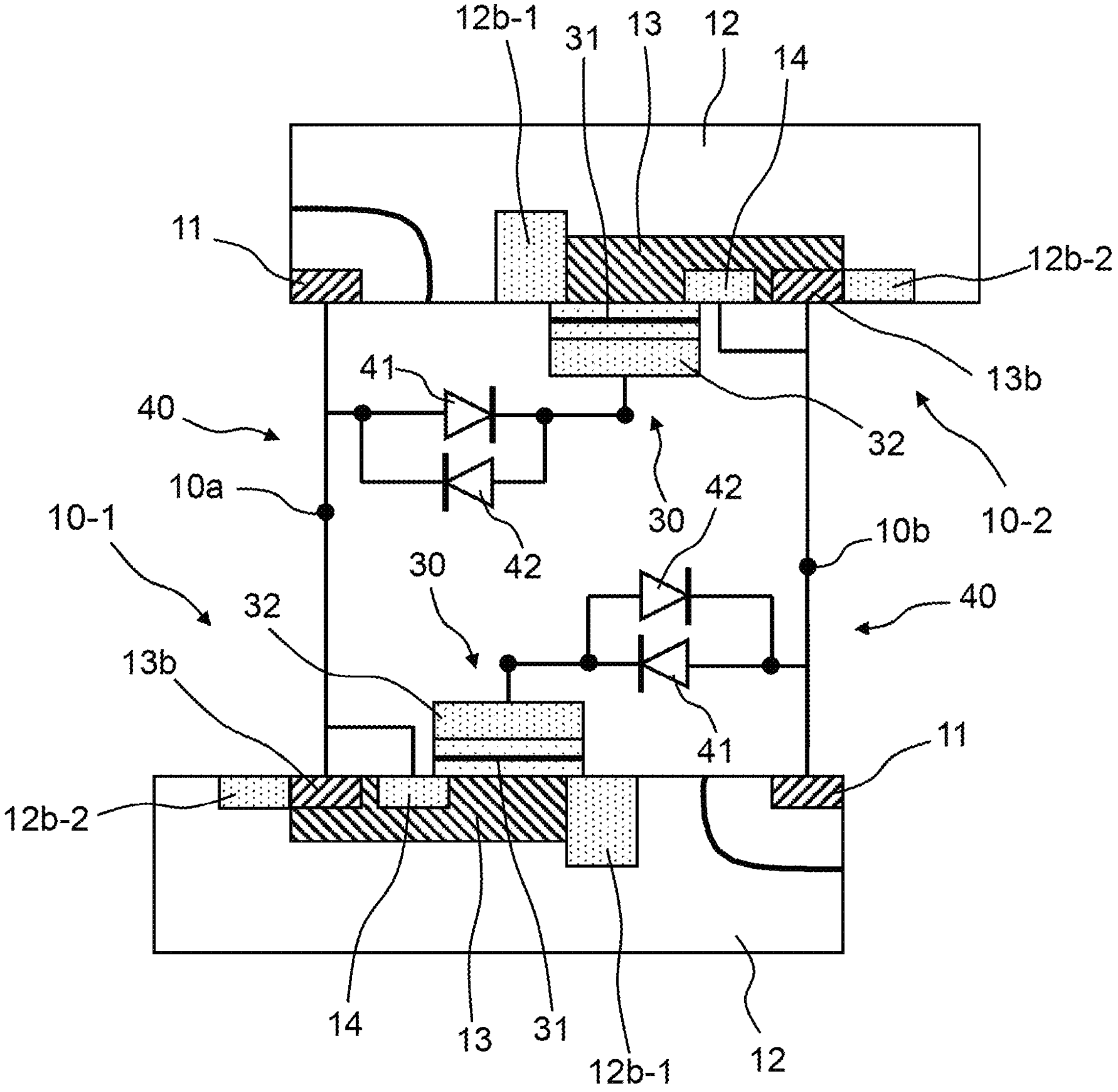
FIG. 2C a bidirectional example of IGBT devices according to the disclosure.

FIG. 2C shows a bidirectional application of two IGBT devices 10-1 and 10-2 in a mirror configuration.

Figure 3A:
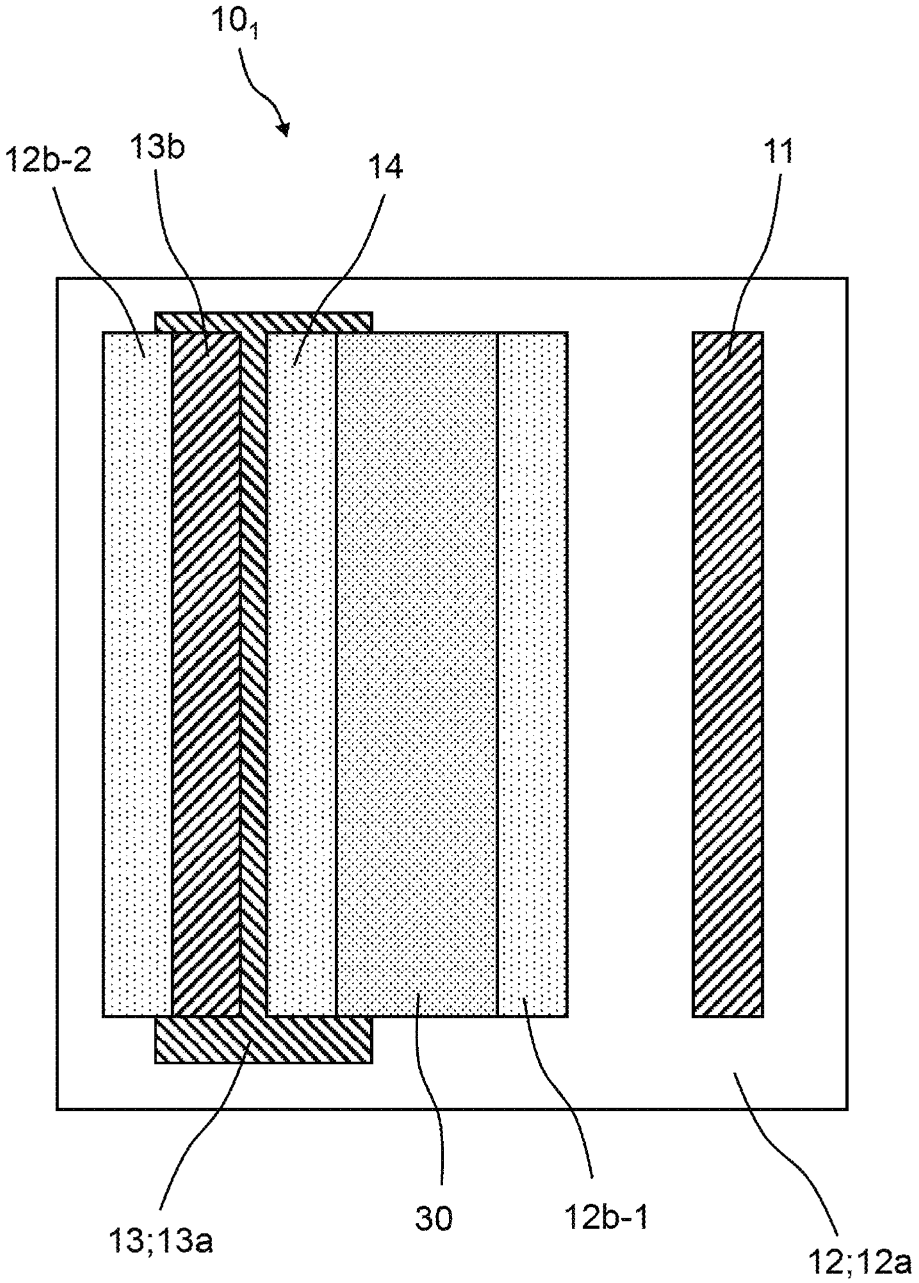
FIGS. 3A, 3B and 3C further examples of an IGBT device according to the disclosure.

FIG. 3A depicts a top view of the IGBT device $10_1$ as shown in FIG. 2A.

Figure 3B:
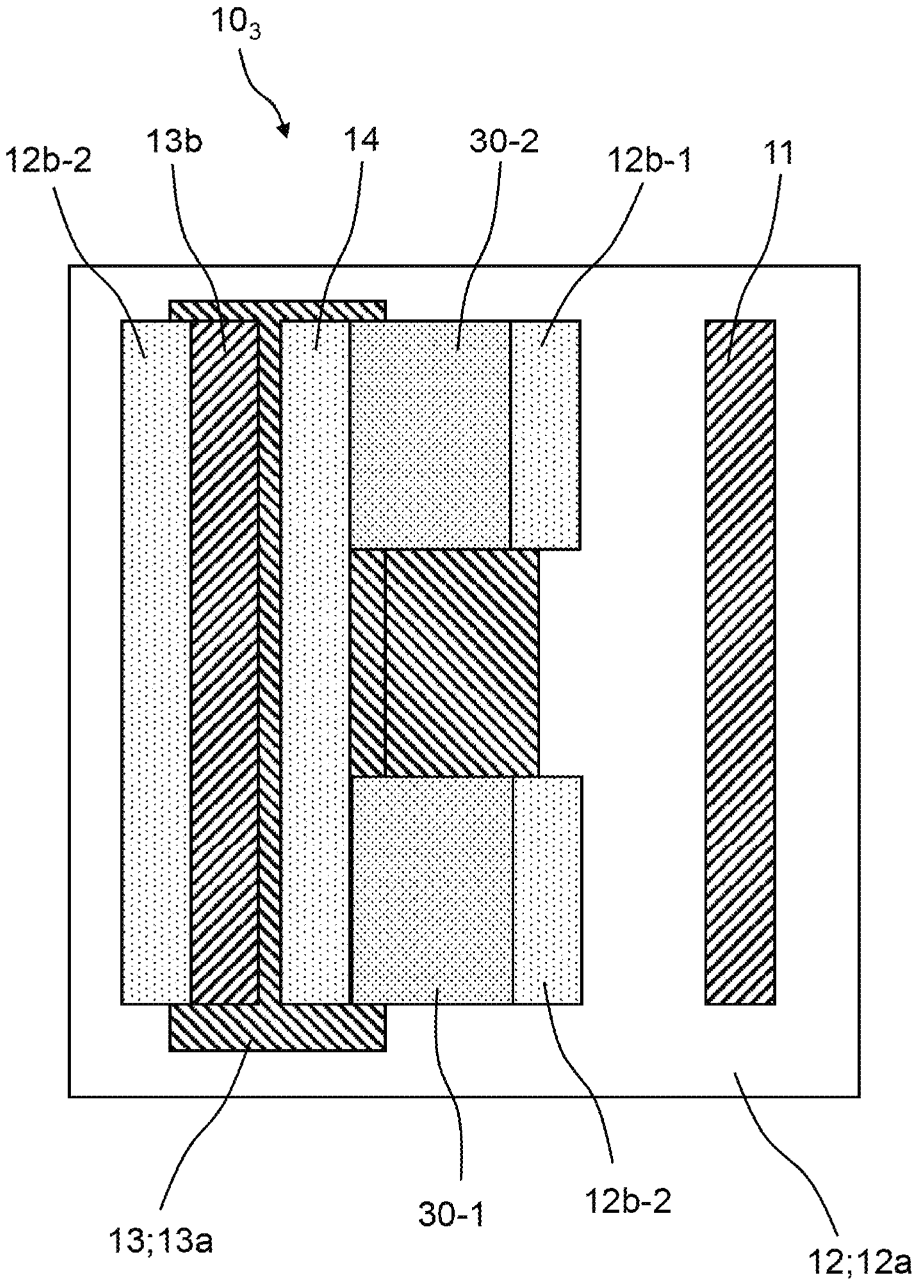
Figure 3C:
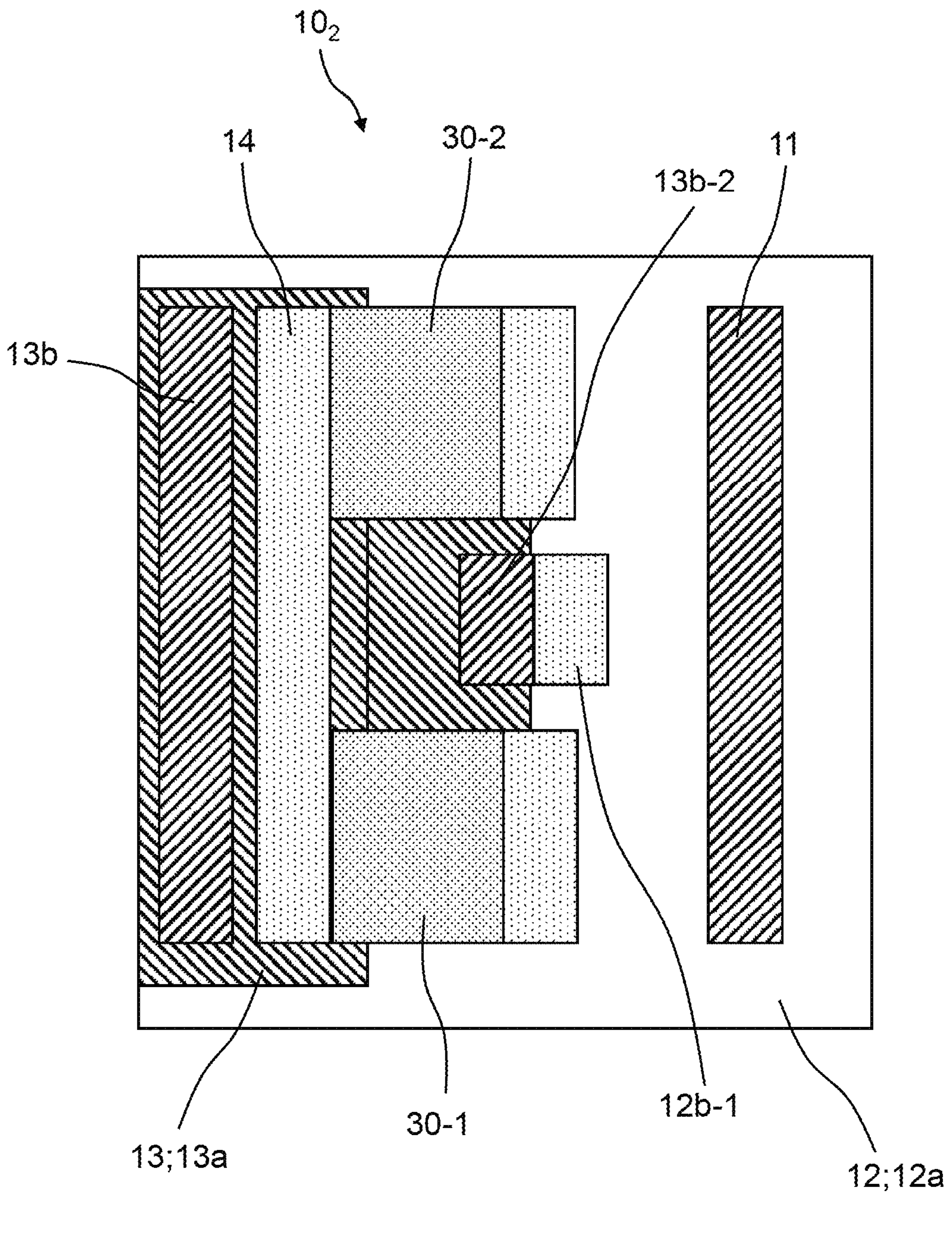

FIGS. 3B and 3C depict a top view of another example of an IGBT device 102, wherein the gate structure 30 is more localized and formed of two gate structure sections 30-1 and 30-2, reducing the depletion regions and thus limiting recombination within the IGBT device. Additionally, in FIG. 3C, the further high dopant region 12*b*-2, which—in FIG. 3B—adjoins the third region 13 and the second emitter terminal 10*b* is omitted, and is in FIG. 3C deposited in the second region 12 between the two gate structure sections 30-1 and 30-2 and adjoins the third region 13, optionally adjoins a high dopant region 13*b*-2 of the third region 13.

Figure 4A:
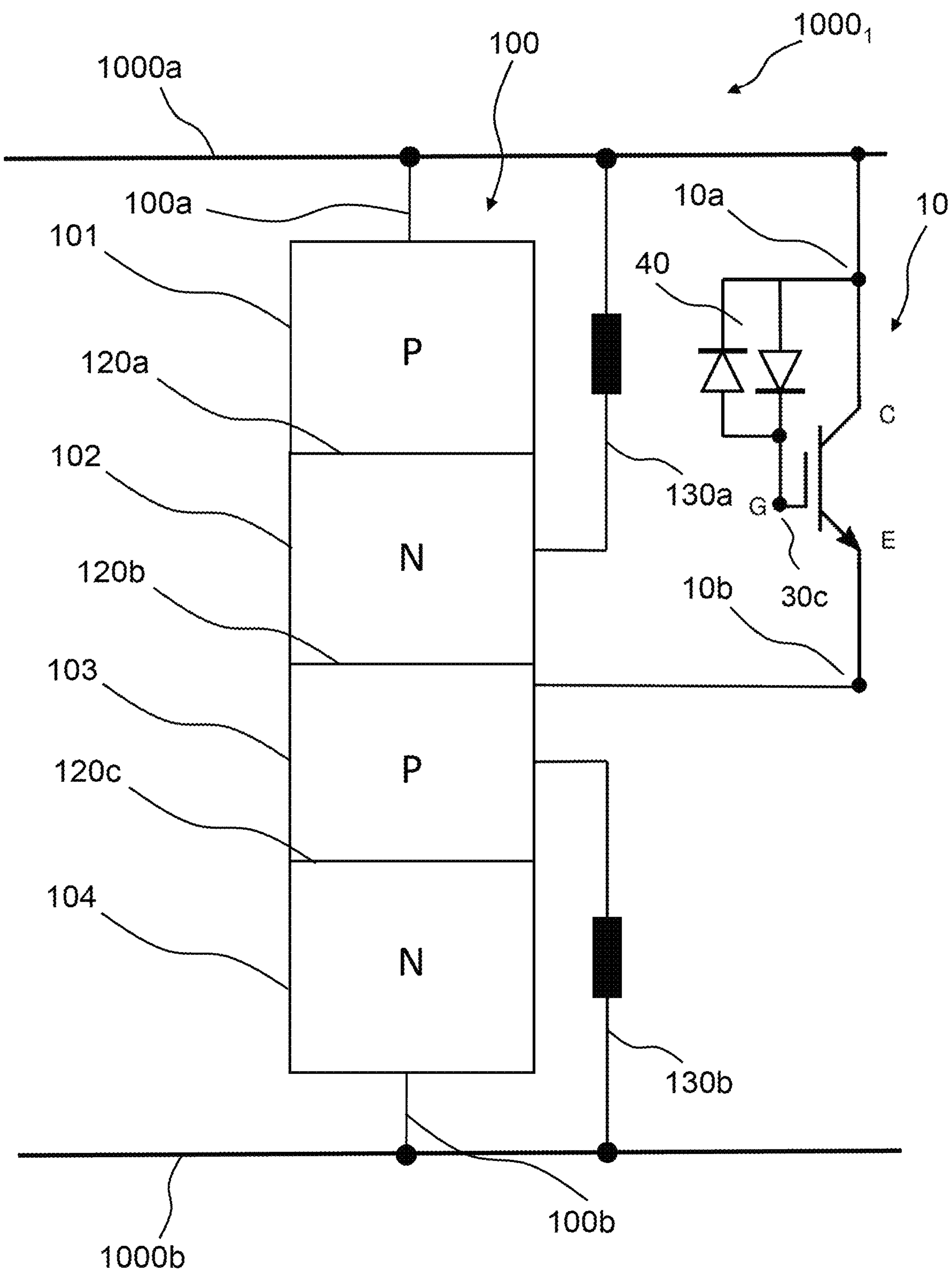
FIGS. 4A, 4B and 4C detailed views of unidirectional examples of a data transmission system implementing an IGBT device according to the disclosure.

FIG. 4A shows another example of the disclosure corresponding with the example shown in FIG. 1. FIG. 4A depicts an unidirectional example of a current-controlled semiconductor system 1000, which comprises a signal line 1000*a* for carrying a signal a ground line 1000*b* for connecting to an electrical ground. The current-controlled semiconductor system 1000 furthermore comprises a semiconductor controlled rectifier, SCR, device, denoted with 100, being electrically connected between both signal line 1000*a* and ground 1000*b*.

The semiconductor controlled rectifier, SCR, device 100 has an input SCR terminal 100*a* and an output SCR terminal 100*b* and is composed of a configuration, e.g. a stack, of four SCR layers. The first SCR layer 101 is doped with a first type of charge carriers, in this example P-type carriers, and is electrically connected via the input SCR terminal 100*a* with the signal line 1000*a*. The first SCR layer 101 forms a first junction 120*a* with a second SCR layer 102, which is doped with a second type of charge carriers N, different from the first type of charge carriers P.

The semiconductor controlled rectifier, SCR, device 100 also comprises a third SCR layer 103, which doped with the first type of P-type charge carriers and the third SCR layer 103 forms a second junction 120*b* with the second SCR layer 102. A fourth SCR layer 104 doped with the second type of N-type charge carriers forms a third junction with the third SCR layer 103. The fourth SCR layer 104 is also electrically connected with the ground line 1000*b* by means of the output SCR terminal 100*b*.

Reference numerals 130*a* and 130*b* denote first and second SCR junction elements. The first SCR junction element 130*a* electrically connects the second SCR layer 102 with the signal line 100*a*. Likewise, the second SCR junction element 130*b* electrically connect the third SCR layer 103 with the ground line 100*b*.

In all configurations, the first and second SCR junction elements 130*a* and 130*b* comprises a resistor.

The configuration example of system $\mathbf{1000}_1$ of FIG. 4A depicts the semiconductor controlled rectifier, SCR, device 100 with both the second and third SCR layers 102 and 103 being electrically connected via a first and a second SCR junction element 130*a* and 130*b* with the signal line 1000*a* and ground line 1000*b*, respectively. However, also configurations with only one SCR junction element are feasible, such as the second SCR layer 102 being electrically connected via the first SCR junction element 130*a* with the signal line 1000*a* (example of system $\mathbf{1000}_2$ of FIG. 4B) or the third SCR layer 103 being electrically connected via the second SCR junction element 130*b* with the ground line 1000*b* (example of system $\mathbf{1000}_3$ of FIG. 4C).

Figure 4B:
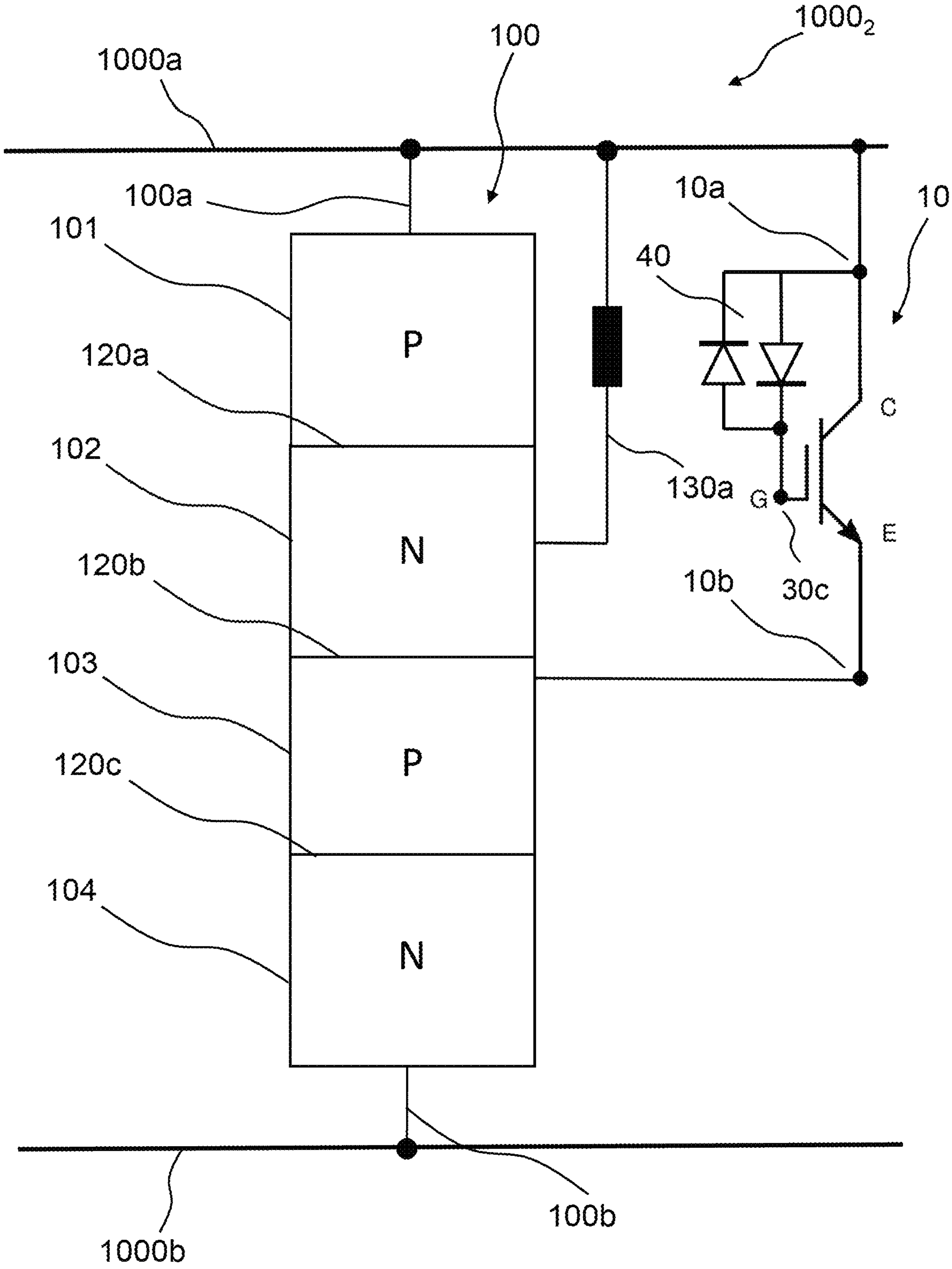
Figure 4C:
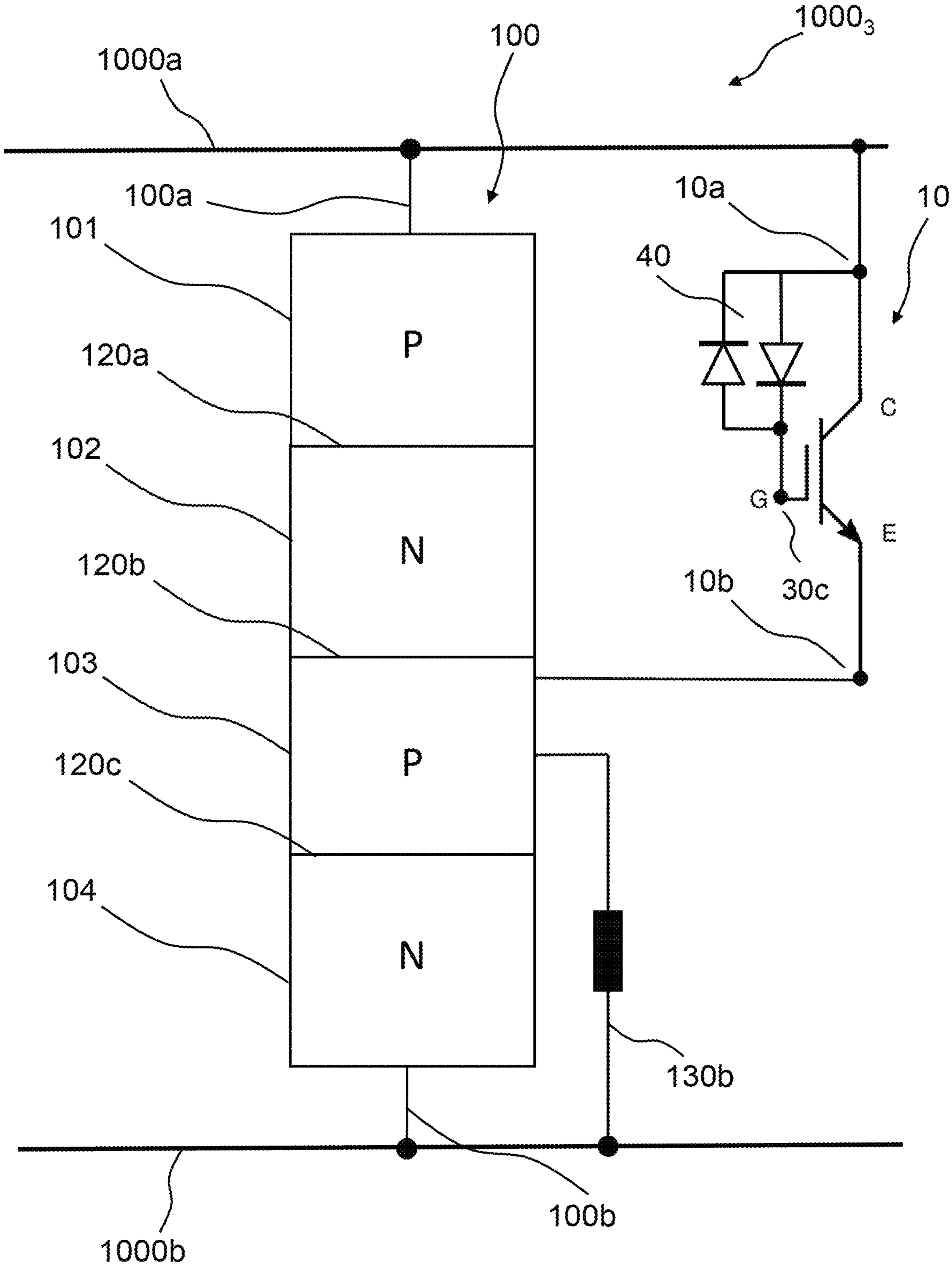

Additionally, in all unidirectional configurations of the current-controlled semiconductor system $\mathbf{1000}_1$-$\mathbf{1000}_2$-$\mathbf{1000}_3$ shown in FIGS. 4A-4C, it furthermore comprises at least one IGBT device 10 according to the disclosure. In the examples of FIGS. 4A-4C, the at least one IGBT device 10 electrically connects the signal line 1000*a* with the third SCR layer 103. The at least one IGBT device 10 has an input terminal 10*a* connected with the signal line 1000*a* and an output terminal 10*b* electrically connected with the third SCR layer 103.

In these unidirectional examples, the IGBT device 10 functions as a trigger in the ESD protection device 100.

Figure 4D:
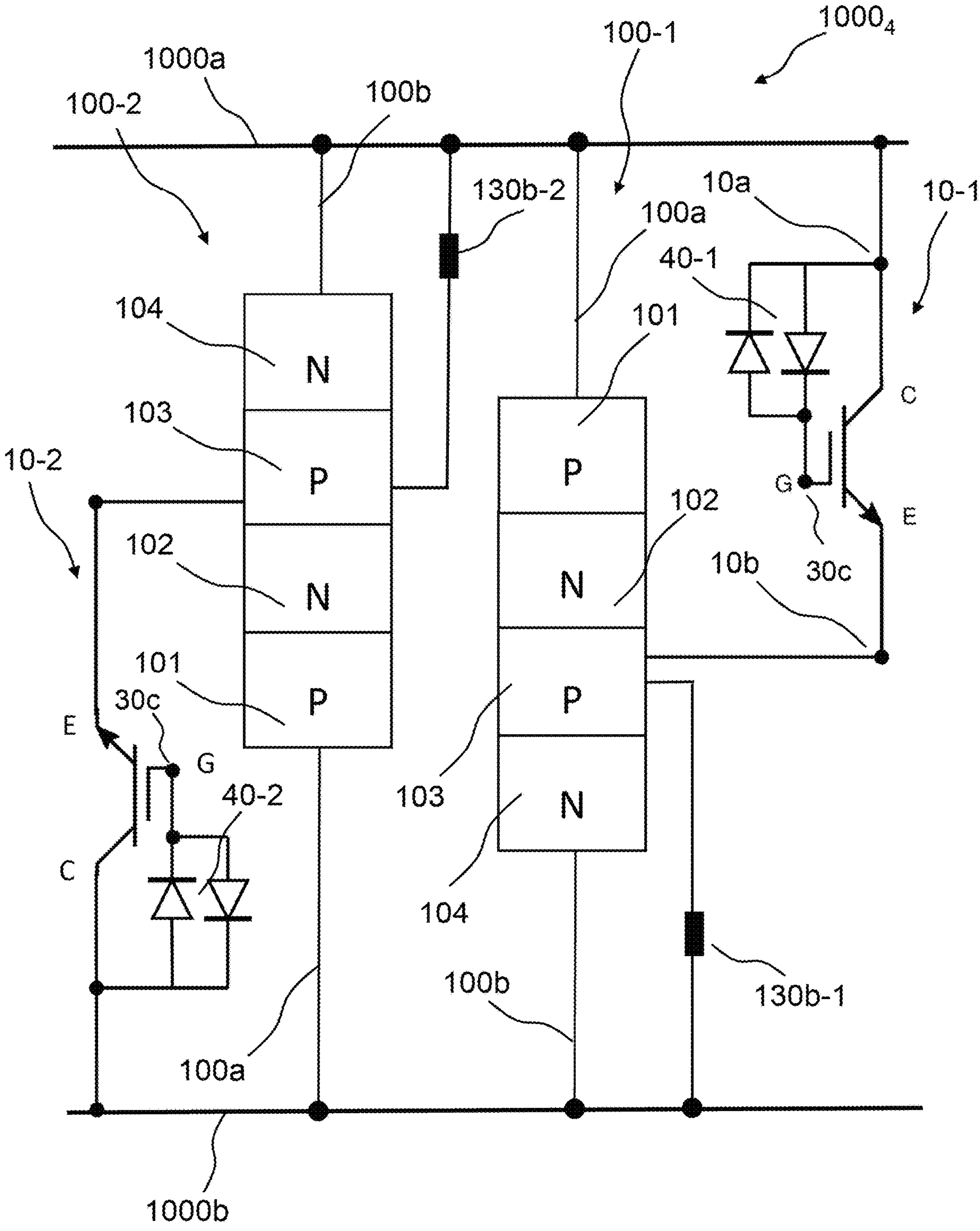
FIG. 4D an bidirectional example of a data transmission system implementing IGBT devices according to the disclosure.

A bidirectional example of the current-controlled semiconductor system $\mathbf{1000}_4$ according to the disclosure is shown in FIG. 4D. Next to the configuration shown in FIG. 4C, with one SCR device 100 and one IGBT device 10, the system $\mathbf{1000}_4$ of FIG. 4D comprises two, yet mirrored combinations of a SCR device 100-1 (100-2) and a IGBT device 10-1 (10-2). The further SCR device 100-2 also comprises a first SCR layer 101 doped with a first type of charge carriers; a second SCR layer 102 doped with a second type of charge carriers different from the first type of charge carriers; a third SCR layer 103 doped with the first type of charge carriers; and a fourth SCR layer 104 doped with the second type of charge carriers.

However, the assembly of SCR device 100-2 and IGBT device 10-2 is mirrored, as the input SCR terminal 100*a* of the SCR device 100-2 is electrically connected with the first SCR layer 101 and the ground line 1000*b*. Also the output SCR terminal 100*b* of the SCR device 100-2 is electrically connected with the fourth SCR layer 104 and the signal line 1000*a*. Similarly, the further insulated-gate bipolar transistor, IGBT, device 100-2 is electrically connecting the ground line 1000*b* with the third SCR layer 103.

In this bidirectional example, each IGBT device 10-1, 10-2 functions as a trigger in the corresponding ESD protection device 100-1, 100-2 depending on the polarity of the signal applied on either signal line 1000*a* or ground line 1000*b*.

It should be noted, that for both the insulated-gate bipolar transistor, IGBT, device and the current-controlled semiconductor system, that the first type of charge carriers may be P-type carriers, whereas the second type of charge carriers may be N-type carriers. However, the reversed configuration, wherein the first type of charge carriers are N-type carriers and the second type of charge carriers are P-type carriers is equally appliable in achieving the desired effect of creating one of both of the emitter base junctions having a low capacitance.

Figure 4E:
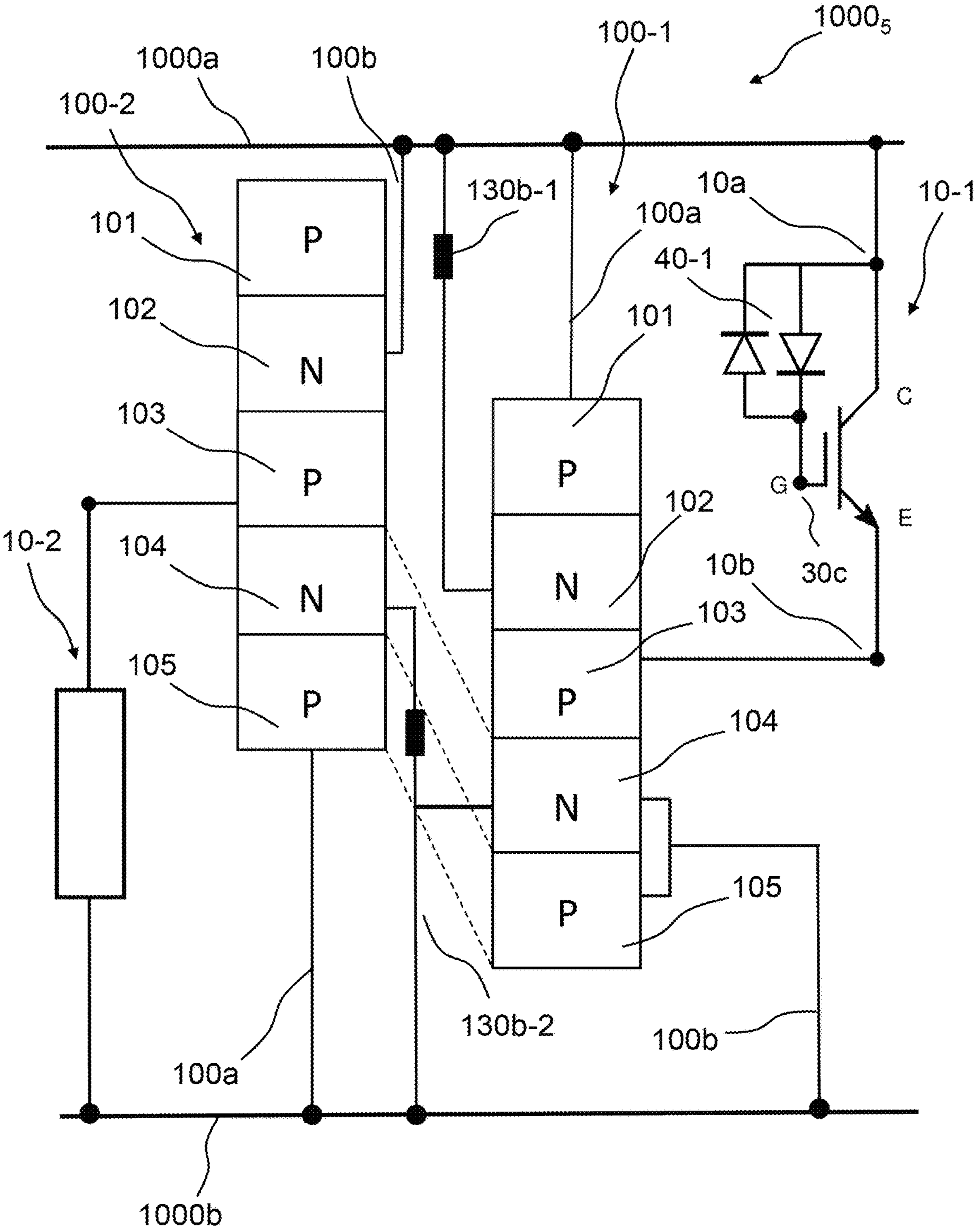
FIGS. 4E and 4F further bidirectional examples of a data transmission system implementing IGBT devices according to the disclosure.

A further bidirectional example of the current-controlled semiconductor system 1000$_5$ according to the disclosure is shown in FIG. 4E. Next to the configuration shown in FIG. 4C, with one SCR device 100 and one IGBT device 10, the system 1000$_5$ of FIG. 4E comprises two, yet mirrored combinations of a SCR device 100-1 (100-2) and one IGBT device 10-1. Both SCR devices 100-1 and 100-2 comprise a first SCR layer 101 doped with a first type of charge carriers; a second SCR layer 102 doped with a second type of charge carriers different from the first type of charge carriers; a third SCR layer 103 doped with the first type of charge carriers; and a fourth SCR layer 104 doped with the second type of charge carriers. Also a fifth SCR layer 105 doped with the first type of charge carriers is present.

Preferably, the fourth SCR layers 104 of both SCR devices 100-1 and 100-2 are formed as a single, joined region, and the same applies to the fifth SCR layer 105 of both SCR devices 100-1 and 100-2, as is shown by means of the dashed interconnecting lines in FIG. 4E.

In the first SCR device 100-1, the input SCR terminal 100*a* is electrically connected with the first SCR layer 101 and the signal line 1000*a*. A SCR junction element 130*b*-1 electrically connects the second SCR layer 102 with the signal line 100*a*, and the fourth SCR layer 104 and the fifth SCR layer 105 are interconnected with each other via a short and connected via the output SCR terminal 100*b* with the ground line 1000*b*. The IGBT device 10-1 is electrically connecting the signal line 1000*a* with the third SCR layer 103.

In the mirrored second SCR device 100-2, the input SCR terminal 100*a* is electrically connected with the fifth SCR layer 105 and the ground line 1000*b*, and the output SCR terminal 100*b* of the second SCR device 100-2 is electrically connected with the second SCR layer 102 and the signal line 1000*a*. A junction element 10-2 electrically connects the third SCR layer 103 with the ground line 1000*b*, and the fourth SCR layer 104 is electrically connected with the ground line 1000*b* via a SCR junction element 130*b*-2, which may be a resistor. Note, that that the junction element 10-2 is different than the IGBT device 10-1 used for the first SCR device 100-1.

Figure 4F:
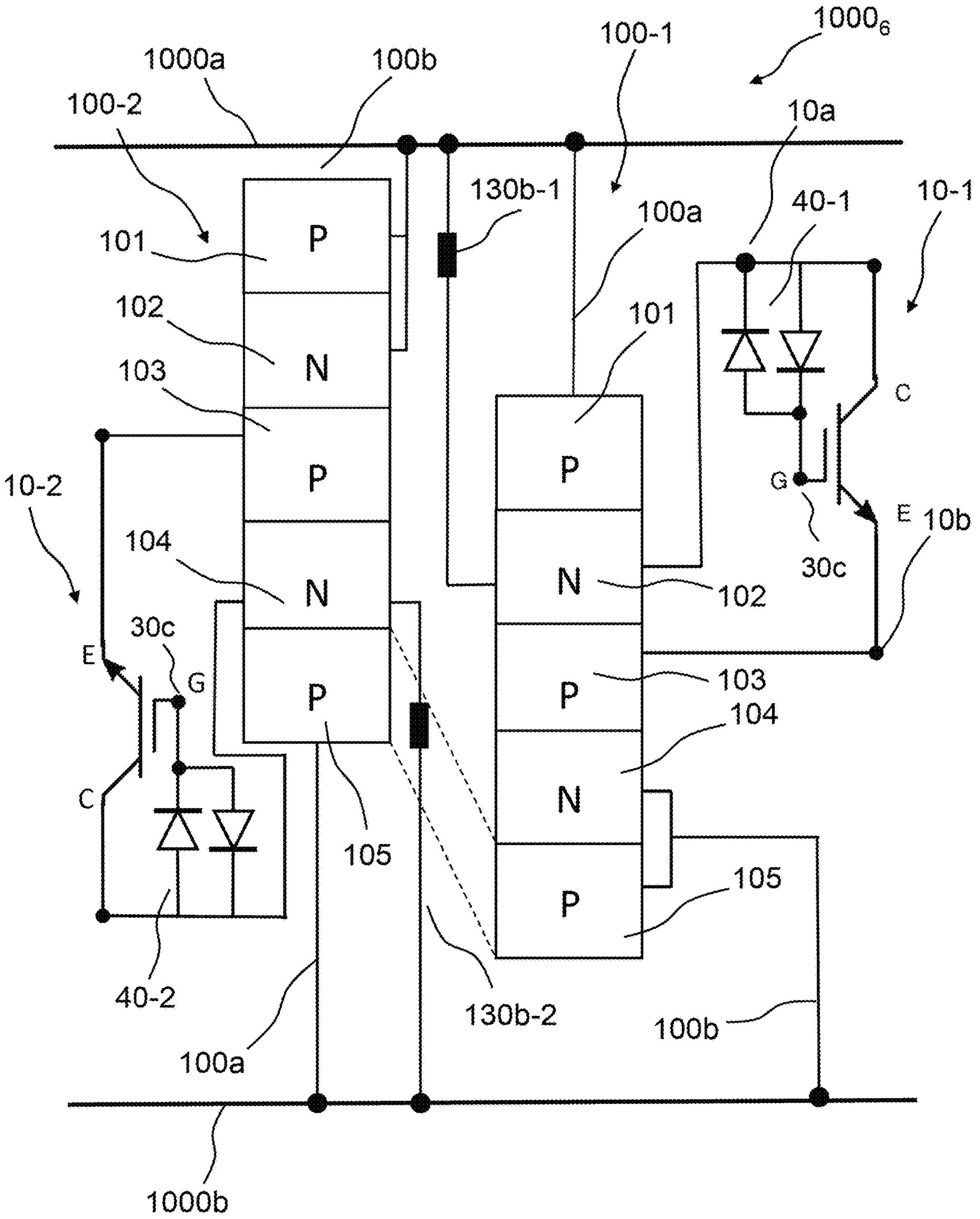

A further bidirectional example of the current-controlled semiconductor system 1000$_6$ according to the disclosure is shown in FIG. 4F. More or less similar to the configuration shown in FIG. 4E, the system 1000$_6$ of FIG. 4F comprises two mirrored combinations of a SCR device 100-1 (100-2), and each also provided with an IGBT device 10-1 (10-2). As in FIG. 4E, also in FIG. 4F, both SCR devices 100-1 and 100-2 comprise a first SCR layer 101 doped with a first type of charge carriers; a second SCR layer 102 doped with a second type of charge carriers different from the first type of charge carriers; a third SCR layer 103 doped with the first type of charge carriers; and a fourth SCR layer 104 doped with the second type of charge carriers. Also a fifth SCR layer 105 doped with the first type of charge carriers is present.

Contrary to the example shown in FIG. 4E, in this example of FIG. 4F, the fifth SCR layers 105 of both SCR devices 100-1 and 100-2 are formed as a single, joined region, as is shown by means of the dashed interconnecting lines in FIG. 4F.

In the first SCR device 100-1, the input SCR terminal 100*a* is electrically connected with the first SCR layer 101 and the signal line 1000*a*. A SCR junction element 130*b*-1 electrically connects the second SCR layer 102 with the signal line 100*a*, and the fourth SCR layer 104 and the fifth SCR layer 105 are interconnected with each other via a short and connected via the output SCR terminal 100*b* with the ground line 1000*b*. The IGBT device 10-1 is electrically connecting the second SCR layer 102 with the third SCR layer 103.

In the mirrored second SCR device 100-2, the input SCR terminal 100*a* is electrically connected with the fifth SCR layer 105 and the ground line 1000*b*, and the output SCR terminal 100*b* of the second SCR device 100-2 is electrically connected with both the first SCR layer 101 and the second SCR layer 102 as well as with the signal line 1000*a*. The IGBT device 10-2 is electrically connecting the third SCR layer 103 with the fourth SCR layer 104. The fourth SCR layer 104 is also electrically connected with the ground line 1000*b* via a SCR junction element 130*b*-2, which may be a resistor.

Beneficial examples as to the high doping used may include a high dopant region having a doping greater than $1\times10^{15}$ cm$^{-3}$ and a layer thickness greater than 0.2 μm, more in particular a doping greater than $1\times10^{16}$ cm$^{-3}$ and a layer thickness greater than 1 μm. Likewise, as to the low doping, the low dopant region may have a doping smaller than $1\times10^{15}$ cm$^{-3}$ and a layer thickness greater than 1 μm, more in particular a doping smaller than $1\times10^{14}$ cm$^{-3}$ and a layer thickness greater than >2 μm.

LIST OF REFERENCE NUMERALS

10, 10$_1$-10$_3$ insulated-gate bipolar transistor device (1$^{st}$-3$^{rd}$ example of the disclosure)
10*a* first (collector) terminal
10*b* second (emitter) terminal
11 first region
12 second region
12*a* low dopant region of second region
12*b*-1/12*b*-2 high dopant region of second region
13 third region
13*a* low dopant region of third region
13*b* high dopant region of third region
14 fourth region
15 junction element/short
20*a*-20*c* first, second and third junction interface
30 gate structure
30*a*-30*b* first/second end of gate structure
30*c* gate terminal
31 gate oxide
32 gate material
40 antiparallel diode structure
40*a* first diode structure terminal
40*b* second diode structure terminal
41/42 first/second diode device
41-1/42-1 first dopant region of first/second diode device
41-2/42-2 second dopant region of first/second diode device
50-1/50-2 first/second boundary deep trench isolation structure
51 buried bottom layer
1000 current-controlled semiconductor system (according to the disclosure)
1000*a* signal line
1000*b* ground line
100 semiconductor controlled rectifier, SCR, device

100*a* input SCR terminal
100*b* output SCR terminal
101 first SCR layer
102 second SCR layer
103 third SCR layer
104 fourth SCR layer
120*a/b/c* first, second and third SCR junction interface
130*a* first SCR junction element
130*b* second SCR junction element

What is claimed is:

1. An insulated-gate bipolar transistor device comprising:
- a first region doped with a first type of charge carriers;
- a second region doped with a second type of charge carriers different from the first type of charge carriers;
- a third region doped with the first type of charge carriers;
- a fourth region doped with the second type of charge carriers;
- a first, emitter terminal electrically connected with the first region and a second, collector terminal electrically connected with the third region and the fourth region;
- a gate structure disposed on the third region with one end adjacent to the second region and with another end adjacent the fourth region; and
- a diode structure having a first diode structure terminal electrically connected with the collector terminal and a second diode structure terminal electrically connected with the gate terminal of the gate structure,
- wherein the diode structure is a single diode structure or an antiparallel diode structure.

2. The insulated-gate bipolar transistor device according to claim 1, wherein the first region is formed as a well in the second region.

3. The insulated-gate bipolar transistor device according to claim 1, wherein the third region is formed as a well in the second region.

4. The insulated-gate bipolar transistor device according to claim 1, wherein the fourth region is formed as a well in the third region.

5. The insulated-gate bipolar transistor device according to claim 1, wherein the third region comprises a low dopant region adjoining the fourth region and the gate structure, and a high dopant region adjoining second terminal, and wherein the doping of the high dopant region is higher than the doping of the low dopant region.

6. The insulated-gate bipolar transistor device according to claim 1, wherein the second region comprises a low dopant region adjoining the first region, and a high dopant region adjoining the third region and the gate structure, and wherein the doping of the high dopant region is higher than the doping of the low dopant region.

7. The insulated-gate bipolar transistor device according to claim 1, wherein the second region comprises a further high dopant region adjoining the third region and the second terminal.

8. The insulated-gate bipolar transistor device according to claim 1, wherein the first region and/or the fourth region are high dopant regions.

9. The insulated-gate bipolar transistor device according to claim 1, wherein each diode device of the antiparallel diode structure comprises a first diode region doped with a first type of charge carriers and a second diode region doped with a second type of charge carriers, and wherein the first diode region and the second diode region are formed as a well in the second region.

10. The insulated-gate bipolar transistor device according to claim 2, wherein the third region is formed as a well in the second region.

11. The insulated-gate bipolar transistor device according to claim 2, wherein the fourth region is formed as a well in the third region.

12. The insulated-gate bipolar transistor device according to claim 2, wherein the third region comprises a low dopant region adjoining the fourth region and the gate structure, and a high dopant region adjoining second terminal, and wherein the doping of the high dopant region is higher than the doping of the low dopant region.

13. The insulated-gate bipolar transistor device according to claim 2, wherein the second region comprises a low dopant region adjoining the first region, and a high dopant region adjoining the third region and the gate structure, and wherein the doping of the high dopant region is higher than the doping of the low dopant region.

14. The insulated-gate bipolar transistor device according to claim 9, wherein the first diode region and/or the second diode region are high dopant regions.

15. The insulated-gate bipolar transistor device according to claim 9, wherein the second region is provided with a boundary deep trench isolation structure for each diode device of the antiparallel diode structure.

16. The insulated-gate bipolar transistor device according to claim 15, wherein each boundary deep trench isolation structure comprises one or more buried bottom layers.

17. A current-controlled semiconductor system comprising:
- a signal line to carry a signal;
- a ground line to connect to ground; and
- at least one semiconductor controlled rectifier (SCR) device, the at least one SCR device comprising:
- a first SCR layer doped with a first type of charge carriers;
- a second SCR layer doped with a second type of charge carriers different from the first type of charge carriers;
- a third SCR layer doped with the first type of charge carriers;
- a fourth SCR layer doped with the second type of charge carriers; and
- an input SCR terminal electrically connected with the first SCR layer and the signal line, and an output SCR terminal electrically connected with the fourth SCR layer and the ground line, and at least one insulated-gate bipolar transistor device according to claim 1, electrically connecting the signal line and the third SCR layer.

18. A current-controlled semiconductor system according to claim 17, further comprising:
- a further SCR device comprising a first SCR layer doped with a first type of charge carriers;
- a second SCR layer doped with a second type of charge carriers different from the first type of charge carriers;
- a third SCR layer doped with the first type of charge carriers;
- a fourth SCR layer doped with the second type of charge carriers; and
- an input SCR terminal electrically connected with the first SCR layer and the ground line, and an output SCR terminal electrically connected with the fourth SCR layer and the signal line.

* * * * *